US007567092B2

(12) United States Patent

Park et al.

(10) Patent No.: US 7,567,092 B2

(45) Date of Patent: Jul. 28, 2009

(54) LIQUID CRYSTAL DISPLAY DRIVER INCLUDING TEST PATTERN GENERATING CIRCUIT

(75) Inventors: Jee-woo Park, Seoul (KR); Won-sik Kang, Seoul (KR); Jong-kon Bae, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 58 days.

(21) Appl. No.: 11/692,562

(22) Filed: Mar. 28, 2007

(65) Prior Publication Data

US 2007/0236243 A1 Oct. 11, 2007

(30) Foreign Application Priority Data

Apr. 11, 2006 (KR) ..................... 10-2006-0032744

(51) Int. Cl.
*G01R 31/00* (2006.01)

(52) U.S. Cl. ..................................................... 324/770

(58) Field of Classification Search ................. 324/770, 324/765, 760, 763, 158.1; 349/40-42, 38, 349/48; 345/94, 100, 204
See application file for complete search history.

(56) References Cited

U.S. PATENT DOCUMENTS 6,873,174 B2 * 3/2005 Matsunaga et al. .......... 324/770
2005/0276088 A1 * 12/2005 Moon et al. .................. 365/63

FOREIGN PATENT DOCUMENTS

| | | | |
|---|---|---|---|
| JP | 06-308905 | | 11/1994 |
| JP | 08-184794 | | 7/1996 |
| JP | 09-218658 | | 8/1997 |
| JP | 10-069257 | | 3/1998 |
| KR | 100256297 | B1 | 2/2000 |
| KR | 100260362 | B1 | 4/2000 |
| KR | 1020020037089 | A | 5/2002 |

OTHER PUBLICATIONS

Notice of Office Action issued by the Korean Patent Office on Aug. 28, 2008 during examination of corresponding Korean application No. 10-2006-0032744.

* cited by examiner

*Primary Examiner*—Ha Tran T Nguyen
*Assistant Examiner*—Tung X Nguyen
(74) *Attorney, Agent, or Firm*—F. Chau & Assoc., LLC

(57) ABSTRACT

A liquid crystal display (LCD) driver including a normal mode circuit, a test pattern generating circuit, a selection circuit, and a timing controller. The normal mode circuit generates a normal mode signal related to a normal image data writing operation of an LCD. The test pattern generating circuit generates a test mode signal related to a test image data writing operation of the LCD. The selection circuit selects one of the normal mode signal and the test mode signal. The timing controller includes a memory storing image data that constructs a normal image pattern or a test image pattern displayed on an LCD panel of the LCD in response to an output signal of the selection circuit.

10 Claims, 5 Drawing Sheets

LIQUID CRYSTAL DISPLAY DRIVER INCLUDING TEST PATTERN GENERATING CIRCUIT

CROSS-REFERENCE TO RELATED PATENT APPLICATION

This application claims the benefit of Korean Patent Application No. 10-2006-0032744, filed on Apr. 11, 2006, in the Korean Intellectual Property Office, the disclosure of which is incorporated herein in its entirety by reference.

BACKGROUND OF THE INVENTION

1. Technical Field

The present disclosure relates to a liquid crystal display (LCD) and, more particularly, to an LCD driver including a test pattern generating circuit.

2. Discussion of Related Art

A liquid crystal display (LCD) is compact and has a low power consumption compared to other display devices. The LCD is used in various electronic devices, such as notebook computers and mobile phones. In particular, an active matrix type LCD using a thin film transistor as a switching element is suitable for displaying moving images.

FIG. 1 is a block diagram of a conventional system 100 for driving an LCD panel. Referring to FIG. 1, the system 10 includes an LCD panel 110, a driver 120, a CPU interface 170 and a central processing unit (CPU) 180. The CPU 180 is also referred to as a baseband processor.

The driver 120 is directly interfaced to the CPU 180 through the CPU interface 170 and receives image data, for example, R (Red), G (Green) and B (Blue) digital video data, and a control signal from the CPU 180. The driver 120 using the CPU interface 170 may be used in a mobile communication device (or mobile set), such as a cellular phone.

To reduce the access load of the CPU 180 directly communicating with the driver 120 and to support various images, a graphic processor (not shown) may be connected between the driver 120 and the CPU 180. The graphic processor is coupled to the driver 120 through a video interface (or RGB interface) and to the CPU 180 through the CPU interface 170.

The driver 120 includes a timing controller 130, a gate driver circuit 150 and a source driver circuit 160. The timing controller 130 receives the image data and the control signal output from the CPU 180 through the CPU interface 170 and generates a control signal for controlling the operation timing of the gate driver circuit 150 and the source driver circuit 160.

The timing controller 130 includes a memory 140. The memory 140 stores the image data output from the CPU 180 through the CPU interface 170. The memory 140 may be configured using a graphic RAM. The image data stored in the memory 140 is output to the source driver circuit 160 under the control of the timing controller 130.

The gate driver circuit 150 includes a plurality of gate drivers (not shown) and drives gate lines (or scan lines) G1, G2, through to GM of the LCD panel 110 in response to the control signal output from the timing controller 130. The source driver circuit 160 includes a plurality of source drivers (not shown) and drives source lines (or data lines) S1, S2, through to SN of the LCD panel 110 in response to the image data output from the memory 140 and the control signal output from the timing controller 130.

The LCD panel 110 displays an image corresponding to the image data output from the CPU 180 in response to the signals output from the gate driver circuit 150 and the signals output from the source driver circuit 160.

To test an LCD (or LCD module) including the LCD panel 110 and the driver 120, the driver 120 receives signals, including test image data that constructs various test image patterns from a separate external test device (not shown) and controls the received test image patterns to be displayed on the LCD panel 110.

The test of the LCD includes a visual quality test and a test of the reliability of the LCD panel 110. The test image patterns are applied to the LCD panel 110 to check whether the test image patterns, such as a gray pattern, a cross-talk pattern and a flicker pattern, are correctly displayed.

As described above, the conventional driver 120 receives signals required for generating test image patterns from the external test device. Thus, interface conditions of the driver 120 and the external test device must be considered. Accordingly, a test for an LCD employing the conventional driver 120 is complicated and requires a long test time.

SUMMARY OF THE INVENTION

Exemplary embodiments of the present invention provide a liquid crystal display (LCD) driver for easily testing an LCD and reducing test time.

According to an exemplary embodiment of the present invention, there is provided an LCD (Liquid Crystal Display) driver comprising: a normal mode circuit generating a normal mode signal related to a normal image data writing operation of an LCD; a test pattern generating circuit generating a test mode signal related to a test image data writing operation of the LCD; a selection circuit selecting one of the normal mode signal and the test mode signal; and a timing controller including a memory sorting image data that constructs a normal image pattern or a test image pattern for display on an LCD panel of the LCD in response to an output signal of the selection circuit.

The test mode signal may include test image data constructing the test image pattern, a test memory selection signal for activating or deactivating the memory, a test row address signal and a test column address signal designating the position of the test image data stored in the memory, a delayed test enable signal obtained by delaying a test enable signal for enabling the test pattern generating circuit, and a test write clock signal synchronized with the test memory selection signal, the test row address signal and the test column address signal. The selection circuit may be operated in response to the delayed test enable signal.

The test pattern generating circuit may comprise a delay unit delaying the test enable signal to generate the delayed test enable signal; a clock generator enabled in response to the test enable signal and generating the test write clock signal in response to an oscillator clock signal; an address generator generating the test memory selection signal, the test row address signal and the test column address signal in response to the test write clock signal; and a test pattern generator including a storage unit storing test image patterns, selecting one of the test image patterns as the test image pattern in response to a test pattern selection signal and RGB data, and outputting the test image data designated by the test row address signal and the test column address signal of the selected test image pattern.

The clock generator and the address generator may be reset in response to a reset signal.

The test enable signal, the reset signal, and the RGB data may be input from a CPU through a CPU interface and the test pattern selection signal may be input by a user of the LCD driver.

The LCD driver may further comprise an oscillator generating the oscillator clock signal.

The timing controller may receive a control signal output from the CPU through the CPU interface and generate a control signal for controlling the LCD driver to drive the LCD panel. The control signal output from the CPU may be a dot clock signal that is a system clock signal.

The LCD driver may further comprise a gate driver circuit driving gate lines of the LCD in response to a control signal output from the timing controller, and a source driver circuit driving source lines of the LCD panel in response to image data output from the memory and the control signal output from the timing controller.

The timing controller may receive a control signal output from the CPU through the CPU interface and generate the control signal for controlling operation timing of the gate driver circuit and the source driver circuit. The control signal output from the CPU may be a dot clock signal that is a system clock signal.

The LCD driver according to exemplary embodiments of the present invention includes the test pattern generating circuit that generates test image patterns for testing an LCD using an internal oscillator clock signal and, thus, it may test the LCD without using a separate test device. Consequently, the LCD driver of exemplary embodiments of the present invention may easily test the LCD and reduce test time.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF EXEMPLARY EMBODIMENTS

Figure 1:
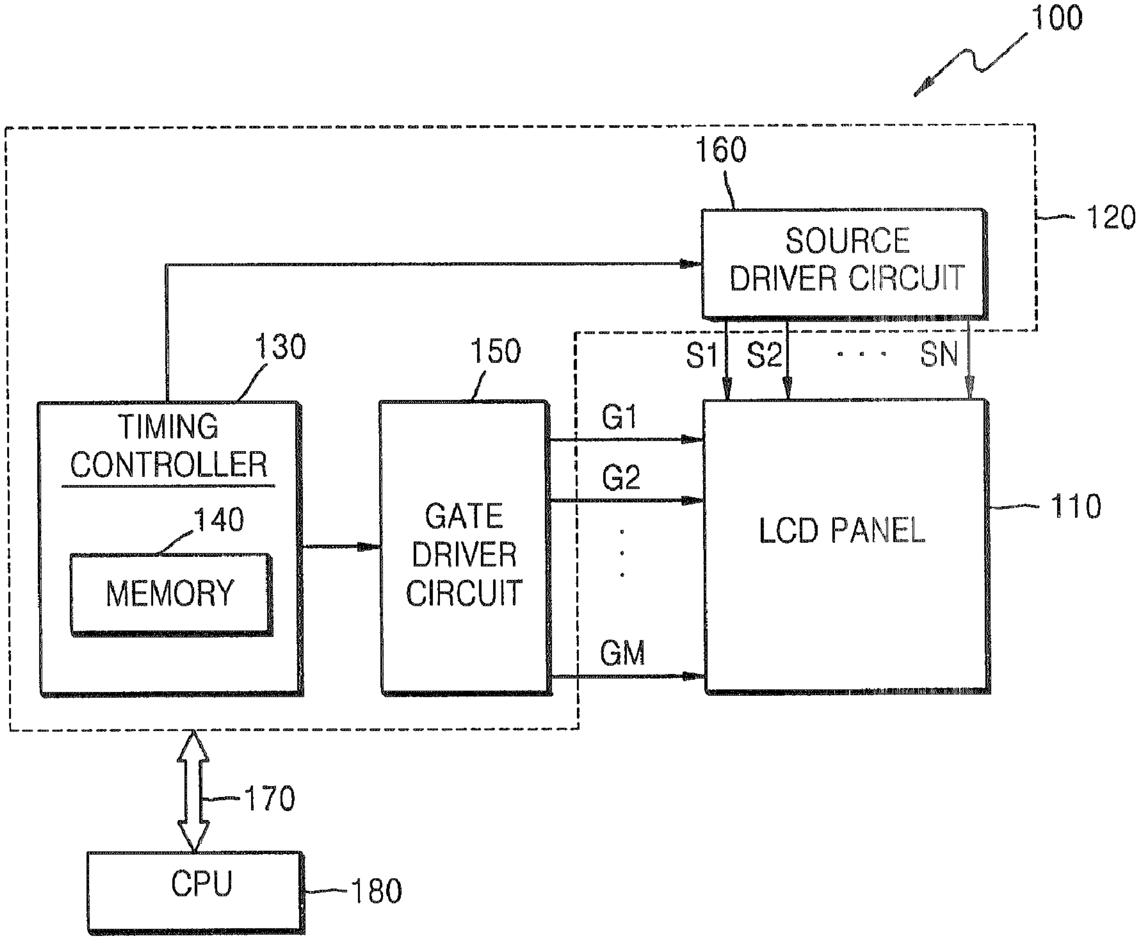
FIG. 1 (CONVENTIONAL ART)
FIG. 1 is a block diagram of a conventional system for driving an LCD panel.

The present invention will now be described more fully with reference to the accompanying drawings, in which exemplary embodiments are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those of ordinary skill in the art. Throughout the drawings, like reference numerals refer to like elements.

Figure 2:
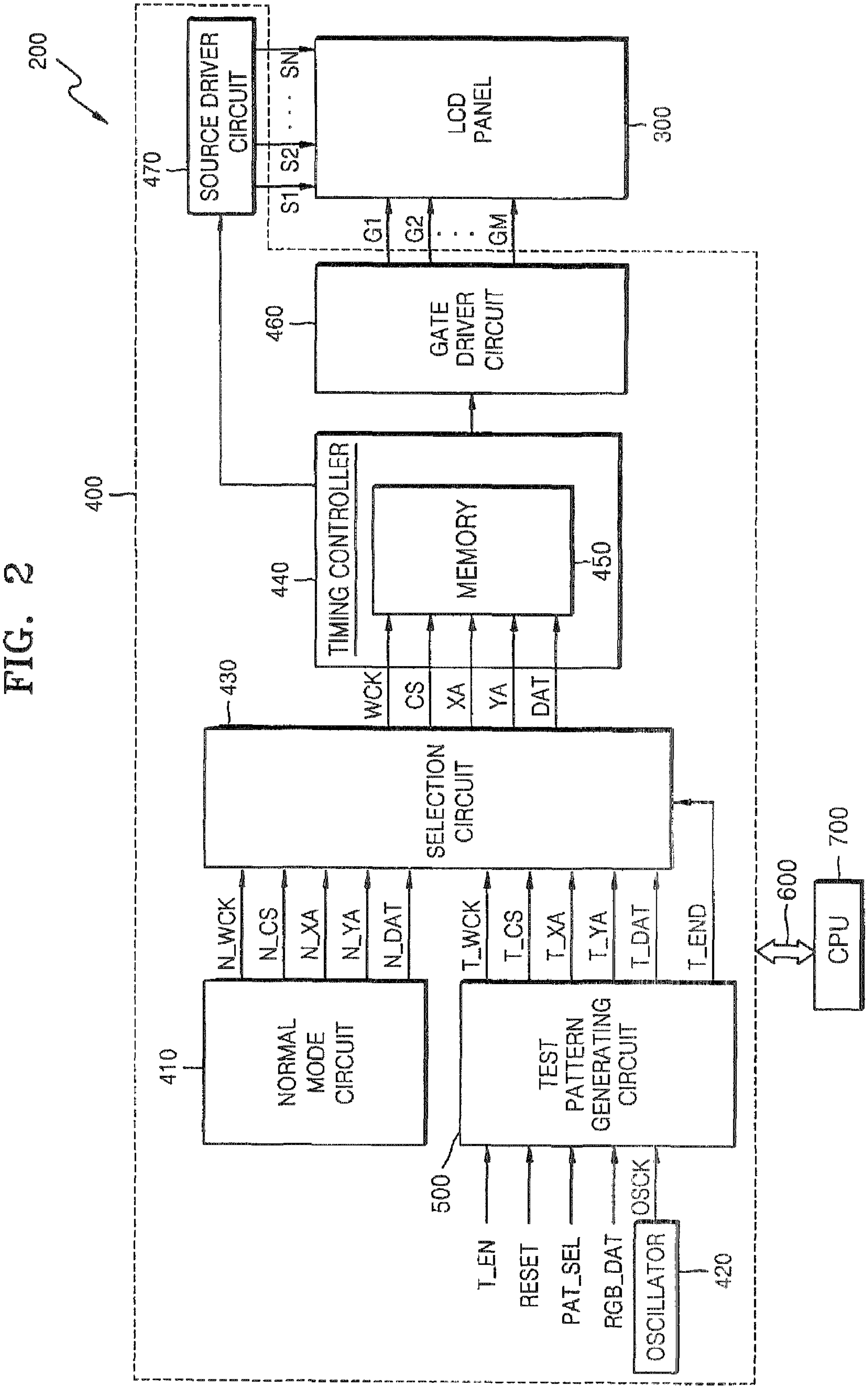
FIG. 2 is a block diagram of an LCD panel driving system including an LCD driver according to an exemplary embodiment of the present invention.

FIG. 2 is a block diagram of a liquid crystal display (LCD) panel driving system 200 including an LCD driver 400 according to an exemplary embodiment of the present invention. Referring to FIG. 2, the LCD panel driving system 200 includes an LCD panel 300, the driver 400, a CPU interface 600, and a CPU 700. The LCD panel 300 and the driver 400 make up an LCD. The CPU 700 may also be referred to as a baseband processor.

The LCD driver 400 according to an exemplary embodiment of the present invention includes a normal mode circuit 410, an oscillator 420, a test pattern generating circuit 500, a selection circuit 430, a timing controller 440, a gate driver circuit 460, and a source driver circuit 470.

The normal mode circuit 410 generates a normal mode signal related to an operation of writing normal image data N_DAT to a memory 450 of the timing controller 440. The normal mode signal includes normal image data N_DAT and normal control signals N_WCK, N_CS, N_XA and N_YA. The normal image data N_DAT constructs a normal image pattern for display on the LCD panel 300. The normal mode circuit 410 generates the normal mode signal including the normal image data N_DAT and normal control signals N_WCK, N_CS, N_XA and N_YA in response to image data and a control signal output from the CPU 700 through the CPU interface 600. The normal control signals include a normal write clock signal N_WCK, a normal memory selection signal N_CS, a normal row address signal N_XA and a normal column address signal N_YA. The control signal output from the CPU 700 may include a dot clock signal that is a system clock signal. The dot clock signal may have a frequency higher than 4 MHz. The normal image data N_DAT may be 24-bit pixel data.

The normal memory selection signal N_CS activates or deactivates the memory 450 of the timing controller 440. The normal row address signal N_XA and the normal column address signal N_YA designate the position (that is, row address and column address) of the normal image data N_DAT stored in the memory 450 of the timing controller 440. The normal memory selection signal N_CS, the normal row address signal N_XA and the normal column address signal N_YA are in synchronization with the normal write clock signal N_WCK that is a reference signal of the normal image data writing operation of the LCD.

The oscillator 420 is included in the driver 400 and generates an oscillator clock signal OSCK. The oscillator clock signal OSCK may have a frequency lower than 4 MHz.

The test pattern generating circuit 500 generates a test mode signal related to an operation of writing test image data T_DAT to the memory 450 of the timing controller 440. The test pattern generating circuit 500 may be referred to as a test mode circuit. The test mode signal includes the test image data T_DAT and test control signals T_WCK, T_CS, T_XA, T_YA and T_END. The test image data T_DAT constructs a test image pattern displayed on the LCD panel 300. The test pattern generating circuit 500 generates the test image data T_DAT and the test control signals T_WCK, T_CS, T_XA, T_YA and T_END in response to a test enable signal T_EN, a reset signal RESET, a test pattern selection signal PAT_SEL, RGB data RGB_DAT and the oscillator clock signal OSCK. The test image data T_DAT may be 24-bit pixel data.

The test enable signal T_EN enables the test pattern generating circuit 500 and the reset signal RESET resets the test pattern generating circuit 500. The test pattern selection signal PAT_SEL selects a test image pattern and is input by a user of the driver 400. The RGB data RGB_DAT is used to combine colors with a test image pattern. When each of the RGB data RGB_DAT is 8-bit data, $16.7\times10^{6}(\approx2^{24})$ colors may be displayed on the LCD panel 300.

The test enable signal T_EN, the reset signal RESET and the RGB data RGB_DAT may be input from the CPU 700 through the CPU interface 600.

The test control signals include a test write clock signal T_WCK, a test memory selection signal T_CS, a test row address signal T_XA, a test column address signal T_YA and a delayed test enable signal T_END. The test memory selection signal T_CS activates or deactivates the memory 450 of the timing controller 440. The test row address signal T_XA and the test column address signal T_YA designate the position, that is, the row address and column address of the test image data T_DAT stored in the memory 450 of the timing controller 440. The test memory selection signal T_CS, the test row address signal T_XA and the test column address signal T_YA are synchronized with the test write clock signal T_WCK that is a reference signal of the test image data writing operation of the LCD.

The selection circuit 430 selects one of the normal mode signal and the test mode signal and outputs the selected signal as output signals WCK, CS, XA, YA and DAT. The selection circuit 430 is operated in response to the delayed test enable signal T_END included in the test mode signal. The selection circuit 430 maybe configured as a multiplexer. The selection circuit 430 may output the test mode signal when the delayed test enable signal T_END is at a logic high level and may output the normal mode signal when the delayed test enable signal T_END is at a logic low level.

The timing controller 440 includes the memory 450 storing the image data DAT that constructs a normal image pattern or a test image pattern displayed on the LCD panel 300 in response to the output signals WCK, CS, XA, YA and DAT of the selection circuit 430. The timing controller 440 receives the control signal output from the CPU 700 through the CPU interface 600 and generates a control signal for controlling operation timing of the gate driver circuit 460 and of the source driver circuit 470. The control signal output from the CPU 700 may include the dot clock signal.

The memory 450 may be a graphic RAM. The image data stored in the memory 450 is output to the source driver circuit 470 under the control of the timing controller 440.

The gate driver circuit 460 includes a plurality of gate drivers (not shown) and drives gate lines (or scan lines) G1, G2, through to GM and the LCD panel 300 in response to the control signal output from the timing controller 440. The source driver circuit 470 includes a plurality of source drivers (not shown) and drives source lines (or data lines) S1, S2, through to SN of the LCD panel 300 in response to the control signal output from the timing controller 440.

The LCD panel 300 displays the normal image pattern or the test image pattern composed of the image data DAT output from the source driver circuit 470 in response to the signals output from the gate driver circuit 460 and the signals output from the source driver circuit 470.

As described above, the LCD driver 400 according to an exemplary embodiment of the present invention includes the test pattern generating circuit 500 that generates the test image pattern using the oscillator clock signal OSCK and, thus, it may test the LCD without using a separate test device. Consequently, the LCD driver 400 of the exemplary embodiment may easily test the LCD and reduce the test time compared with previously proposed systems.

Figure 3:
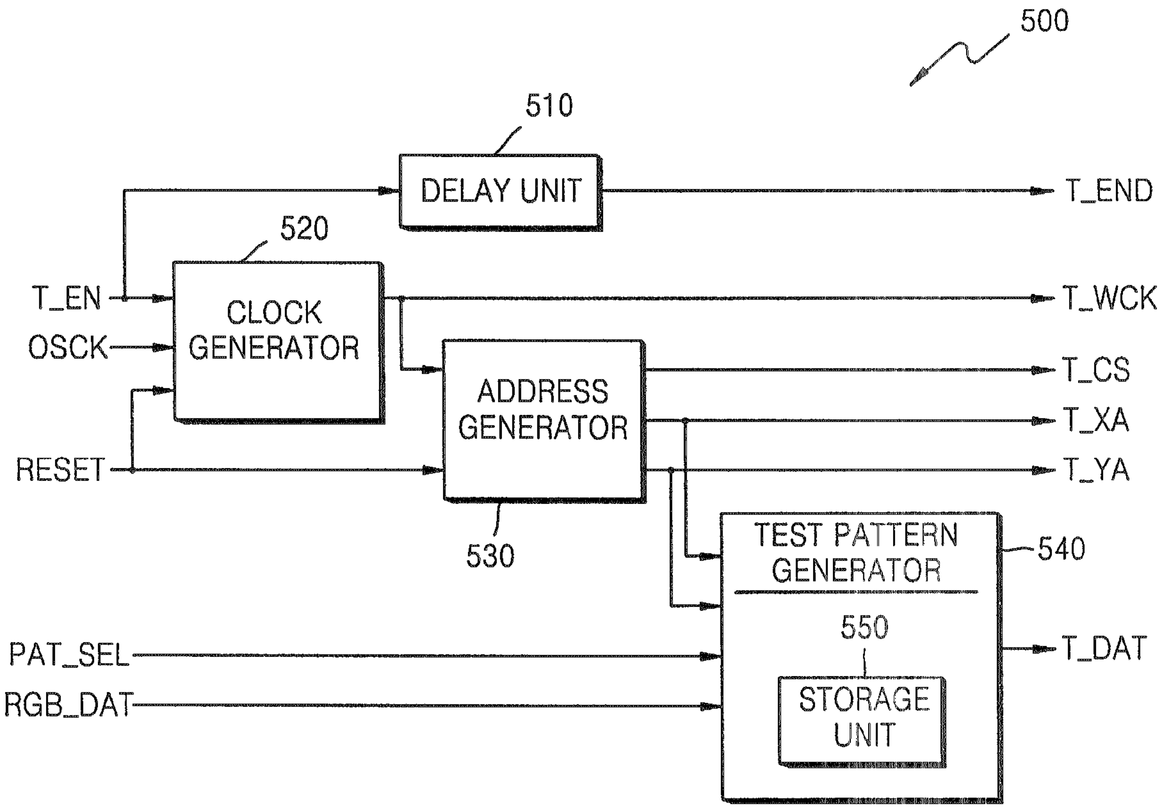
FIG. 3 is a block diagram of a test pattern generating circuit of FIG. 2.

FIG. 3 is a block diagram of the test pattern generating circuit of the system shown in FIG. 2. Referring to FIG. 3, the test pattern generating circuit 500 includes a delay unit 510, a clock generator 520, an address generator 530, and a test pattern generator 540.

The delay unit 510 delays the test enable signal T_EN by a predetermined delay time to generate the delayed test enable signal T_END. The delay time is a time required to synchronize the test enable signal T_EN with the normal mode signal or the test mode signal.

The clock generator 520 is enabled in response to the test enable signal T_EN and is reset in response to the reset signal RESET. The clock generator 520 generates the test write clock signal T_WCK in response to the oscillator clock signal OSCK.

The address generator 530 generates the test memory selection signal T_CS, the test row address signal T_XA, and the test column address signal T_YA in response to the test write clock signal T_WCK. The address generator 530 is reset in response to the reset signal RESET, and it may be configured as a counter.

Figure 4:
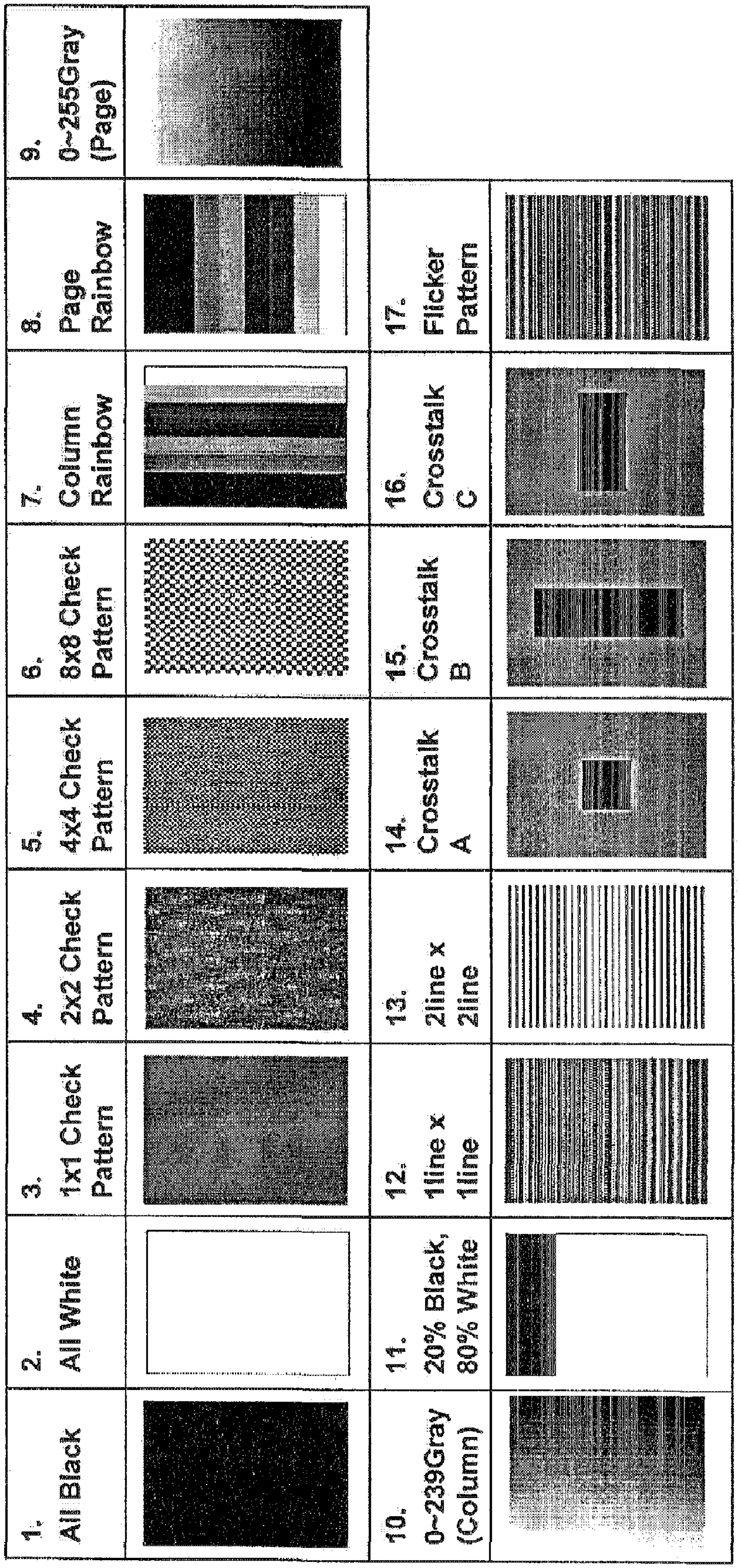
FIG. 4 illustrates test image patterns composed of test image data stored in a storage unit of the circuit shown in FIG. 3.

The test pattern generator 540 includes a storage unit 550 for storing test image patterns displayed on the LCD panel (300 of FIG. 2). The test pattern generator 540 selects one of the test image patterns stored in the storage unit 550 in response to the test pattern selection signal PAT_SEL and the RGB data RGB_DAT and outputs the test image data T_DAT designated by the test row address signal T_XA and the test column address signal T_YA of the selected test image pattern. FIG. 4 illustrates examples of test image patterns corresponding to the test image data T_DAT stored in the storage unit 550.

Figure 5:
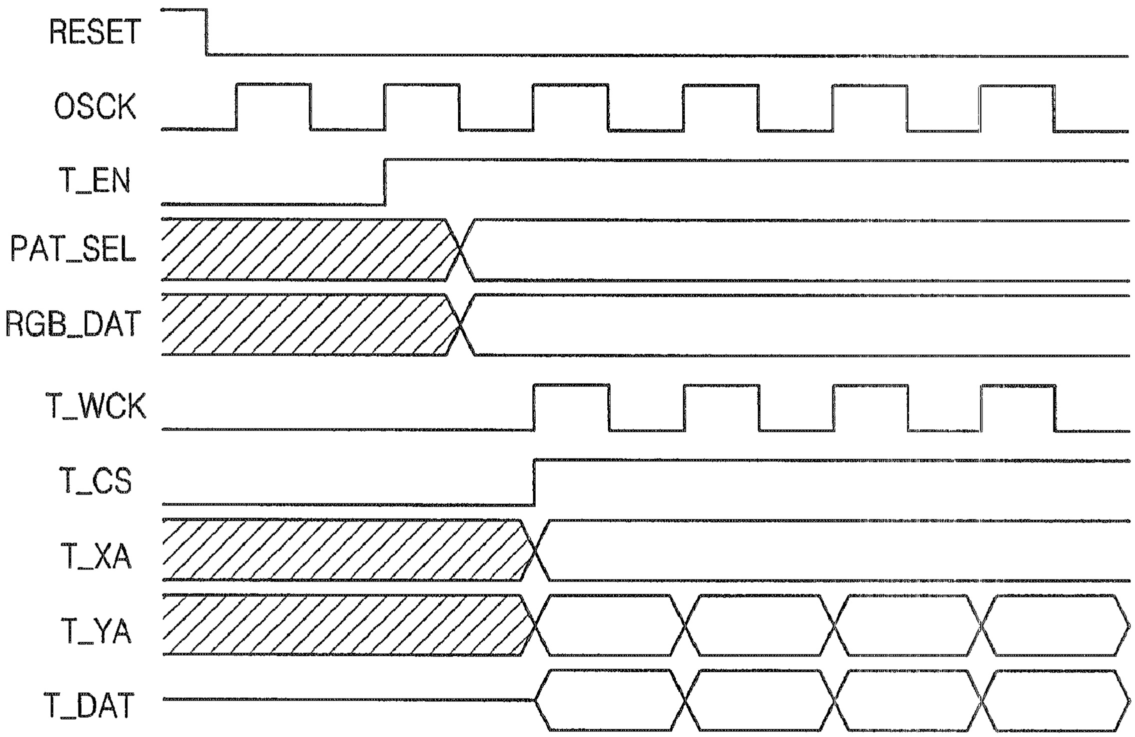
FIG. 5 is a timing diagram of an operation of a test pattern generating circuit of the circuit shown in FIG. 3.

FIG. 5 is a timing diagram of an operation of the test pattern generating circuit 500 of FIG. 3. Referring to FIG. 5, the test enable signal T_EN is enabled to a logic high level in synchronization with a rising edge of the oscillator clock signal OSCK while the reset signal RESET is disabled to a logic low level. Subsequently, the test pattern selection signal PAT_SEL and the RGB data RGB_DAT are generated (or enabled).

The test write clock signal T_WCK may be generated in response to the oscillator clock signal OSCK after one clock cycle of the oscillator clock signal OSCK. The test memory selection signal T_CS, the test row address signal T_XA, and the test column address signal T_YA are enabled in synchronization with a rising edge of the test write clock signal T_WCK.

Then, the test data T_DAT designated by the test row address signal T_XA and the test column address signal T_YA is output. The test data T_DAT constructs a test image pattern selected by the test pattern selection signal PAT_SEL and the RGB data RGB_DAT.

While the present invention has been particularly shown and described with reference to exemplary embodiments thereof, it will be understood by those of ordinary skill in he art that various changes in form and details may be made therein without departing from the spirit and scope of the present invention as defined by the following claims.

What is claimed is:

1. An LCD (liquid crystal display) driver comprising:

a normal mode circuit for generating a normal mode signal related to a normal image data writing operation of an LCD;

a test pattern generating circuit for generating a test mode signal related to a test image data writing operation of the LCD;

a selection circuit for selecting one of the normal mode signal and the test mode signal; and a timing controller including a memory storing image data that constructs a normal image pattern or a test image pattern for display on an LCD panel of the LCD in response to an output signal of the selection circuit, wherein the displayed test image pattern is used for a visual quality test, and wherein the test mode signal includes test image data constructing the test image pattern, a test memory selection signal for activating or deactivating the memory a test row address signal and a test column address signal designating a position of the test image data stored in the memory, a delayed test enable signal obtained by delaying a test enable signal for enabling the test pattern generating circuit, and a test write clock signal synchronized with the test memory selection signal, the test row address signal and the test column address signal, wherein the selection circuit is operated in response to the delayed test enable signal.

2. The LCD driver of claim 1, wherein the test pattern generating circuit comprises:

a delay unit for delaying the test enable signal to generate the delayed test enable signal;

a clock generator enabled in response to the test enable signal, wherein the clock generator generates the test write clock signal in response to an oscillator clock signal;

an address generator for generating the test memory selection signal, the test row address signal, and the test column address signal in response to the test write clock signal; and a test pattern generator including a storage unit storing test image patterns, selecting one of the test image patterns as the test image pattern in response to a test pattern selection signal and RGB data, and outputting the test image data designated by the test row address signal and the test column address signal of the selected test image pattern.

3. The LCD driver of claim 2, wherein the clock generator and the address generator are reset in response to a reset signal.

4. The LCD driver of claim 3, wherein the test enable signal, the reset signal, and the RGB data are input from a CPU through a CPU interface and the test pattern selection signal is input by a user of the LCD driver.

5. The LCD driver of claim 4, further comprising an oscillator generating the oscillator clock signal.

6. The LCD driver of claim 5, wherein the timing controller receives a control signal output from the CPU through the CPU interface and generates a control signal for controlling the LCD driver to drive the LCD panel, and wherein the control signal output from the CPU is a dot clock signal corresponding to a system clock signal.

7. The LCD driver of claim 6, wherein the memory is configured using a graphic RAM.

8. The LCD driver of claim 6, wherein the selection circuit is configured as a multiplexer.

9. The LCD driver of claim 6, wherein the address generator is configured as a counter.

10. The LCD driver of claim 1, further comprising:

a gate driver circuit driving gate lines of the LCD panel in response to a control signal output from the timing controller; and a source driver circuit driving source lines of the LCD panel in response to image data output from the memory and the control signal output from the timing controller, wherein the timing controller receives a control signal output from a CPU through a CPU interface and generates the control signal for controlling operation timing of the gate driver circuit and the source driver circuit, and wherein the control signal output from the CPU is a dot clock signal corresponding to a system clock signal.

* * * * *